United States Patent
Dong et al.

(10) Patent No.: US 11,130,671 B2
(45) Date of Patent: Sep. 28, 2021

(54) MEMS DEVICE AND FABRICATION METHOD THEREOF

(71) Applicant: WUHAN YANXI MICRO COMPONENTS CO., LTD., Wuhan (CN)

(72) Inventors: Wei Dong, Wuhan (CN); Re-ching Lin, Wuhan (CN); Pei-chun Liao, Wuhan (CN)

(73) Assignee: WUHAN YANXI MICRO COMPONENTS CO., LTD., Wuhan (CN)

( * ) Notice: Subject to any disclaimer, the term of this patent is extended or adjusted under 35 U.S.C. 154(b) by 0 days.

(21) Appl. No.: 16/663,314

(22) Filed: Oct. 24, 2019

(65) Prior Publication Data
US 2020/0331749 A1    Oct. 22, 2020

(30) Foreign Application Priority Data

Apr. 22, 2019 (CN) .......................... 2019 1 0325646

(51) Int. Cl.
*B81B 7/00* (2006.01)
*B81C 1/00* (2006.01)

(52) U.S. Cl.
CPC ........ *B81B 7/0058* (2013.01); *B81C 1/00793* (2013.01); *B81C 2203/019* (2013.01)

(58) Field of Classification Search
None
See application file for complete search history.

(56) References Cited

U.S. PATENT DOCUMENTS

| | | | |
|---|---|---|---|
| 8,299,630 B2 * | 10/2012 | Braeuer | ................. B81C 3/001 257/783 |
| 2005/0093134 A1 | 5/2005 | Tarn | |
| 2006/0027915 A1 | 2/2006 | Tarn | |
| 2006/0220223 A1 | 10/2006 | Lu | |
| 2007/0190747 A1 | 8/2007 | Humpston | |
| 2007/0243662 A1 | 10/2007 | Johnson | |
| 2010/0183181 A1* | 7/2010 | Wang | ................... H05K 1/0243 381/361 |
| 2011/0284975 A1 | 11/2011 | Braeuer | |
| 2012/0115305 A1 | 5/2012 | Peng | |
| 2018/0162720 A1 | 6/2018 | Cheng et al. | |

(Continued)

FOREIGN PATENT DOCUMENTS

| | | |
|---|---|---|
| CN | 105565255 A | 5/2016 |
| CN | 106158894 A | 11/2016 |
| CN | 107331625 A | 11/2017 |

(Continued)

OTHER PUBLICATIONS

Partial European Search Report in the European application No. 19200070.1, dated Mar. 17, 2020.

*Primary Examiner* — Thien F Tran
(74) *Attorney, Agent, or Firm* — Syncoda LLC; Feng Ma

(57) ABSTRACT

A Micro-Electro-Mechanical System (MEMS) device includes a substrate, a packaging component provided on the substrate and a MEMS component provided inside the packaging component and on the substrate. The device further includes a sealing component. The sealing component is provided on the substrate and/or the packaging component, for preventing an external small molecule from contacting with the MEMS component.

17 Claims, 13 Drawing Sheets

(56) References Cited

U.S. PATENT DOCUMENTS

2018/0337157 A1 11/2018 Wang et al.

FOREIGN PATENT DOCUMENTS

| | | |
|---|---|---|
| CN | 104326437 B | 12/2017 |
| JP | 2003243160 A | 8/2003 |
| JP | 2005528782 A | 9/2005 |
| JP | 2008542578 A | 11/2008 |
| JP | 2009004650 A | 1/2009 |
| JP | 2015205361 A | 11/2015 |
| KR | 19980080551 A | 11/1998 |
| KR | 20130095489 A | 8/2013 |
| KR | 20140079714 A | 6/2014 |
| KR | 20180038469 A | 4/2018 |
| WO | 2010085942 A2 | 8/2010 |
| WO | 2016209339 A1 | 12/2016 |

* cited by examiner

MEMS DEVICE AND FABRICATION METHOD THEREOF

CROSS-REFERENCE TO RELATED APPLICATIONS

This application claims priority to Chinese Patent Application No. 201910325646.X filed Apr. 22, 2019, the content of which is hereby incorporated by reference in its entirety.

BACKGROUND

A MEMS is a miniature device or system integrating a microsensor, a microactuator, a micromechanical structure, a micro power supply, a micro energy, a signal processing and control circuit, a high-performance electronic integrated device, an interface and communication. The MEMS device, which is developed on the basis of a microelectronic technology (a conductor manufacturing technology), is a high-tech electronic mechanical device manufactured with photolithography, etching, thin film deposition, silicon micromachining, non-silicon micromachining, precision mechanical machining and other technologies jointly.

SUMMARY

The disclosure relates to the field of semiconductors, and in particular to a Micro-Electro-Mechanical System (MEMS) device and a fabrication method thereof.

A MEMS device is provided, including a substrate, a packaging component provided on the substrate and a MEMS component provided inside the packaging component and on the substrate. The device may further include a sealing component.

The sealing component is provided on the substrate and/or the packaging component.

The sealing component is used for preventing an external small molecule from contacting with the MEMS component.

A fabrication method of a MEMS device is provided, including the following steps.

A substrate is formed.

A packaging component is formed on the substrate, a MEMS component is formed inside the packaging component and on the substrate, and a sealing component is formed on the substrate and/or the packaging component.

The sealing component is used for preventing an external small molecule substance from contacting with the MEMS component.

DETAILED DESCRIPTION

Figure 1:
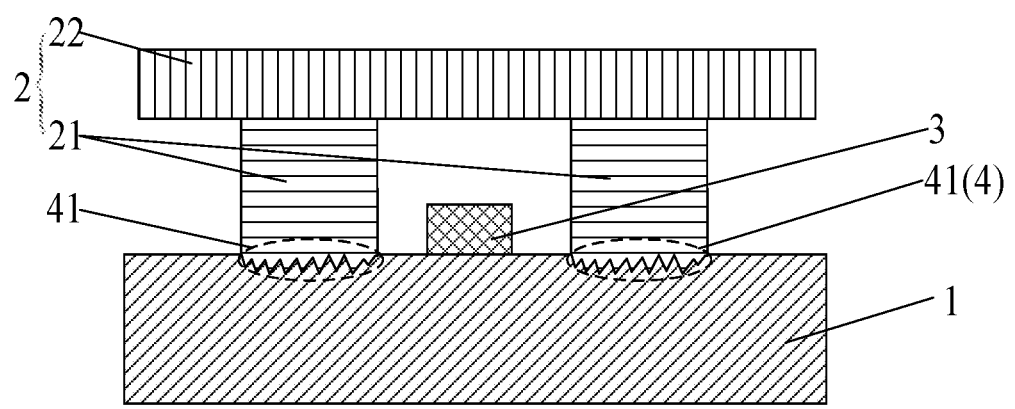
FIG. 1 illustrates a structure diagram of a MEMS device provided by an embodiment of the disclosure.

The technical solutions in the embodiments of the disclosure will be clearly described below in combination with the drawings in the embodiments of the disclosure.

With the unceasingly maturing and development, a MEMS technology has been applied to an integrated circuit gradually. Generally, a MEMS component may be packaged because a structure of a MEMS device is vulnerable and the performance may be susceptible to an external factor. A cavity structure may be used to package some of the MEMS devices to protect the device. The inventor realized that a small molecular (such as a water molecule) substance may penetrate a bonding layer of the cavity structure of the MEMS device over time, and accordingly enter an interior of a closed space and adhere to the MEMS component. As a result, the performance of the device may be adversely influenced.

The embodiments of the disclosure provide a MEMS device and a fabrication method thereof. In this way, the problem that a small molecular substance may enter an interior of a closed space and adhere to a MEMS component in the structure design of an existing MEMS device may be solved, the performance of the MEMS device (especially an acoustic device) may be improved, and the service life of the MEMS device may be prolonged.

An embodiment of the disclosure provides a MEMS device, including a substrate 1, a packaging component 2 provided on the substrate 1 and a MEMS component 3 provided inside the packaging component 2 and on the substrate 1. The MEMS device may further include a sealing component 4.

The sealing component 4 is provided on the substrate 1 and/or the packaging component 2.

The sealing component is used for preventing an external small molecular substance from contacting with the MEMS component.

It is to be noted that the sealing component in the embodiment may be provided at a location where the packaging component and the substrate are in contact with each other, or a location where the elements constituting the packaging component are in contact with each other, or a location surrounding the MEMS component and being surrounded by the packaging component. The location of the sealing component, of course, may not be limited to the above locations only, and other locations capable of preventing an external small molecule from passing through the packaging component and accordingly contacting with the MEMS component may be feasible.

In other embodiments of the disclosure, a packaging component 2 may include a first packaging layer 21 and a second packaging layer 22.

The first packaging layer 21 is provided at a location on a substrate 1 without contacting with the MEMS component, and the first packaging layer surrounds the MEMS component 3.

The second packaging layer 22 is provided on a surface of the first packaging layer 21 far away from the substrate 1 and above a surface of the MEMS component 3 far away from the substrate 1.

The first packaging layer is connected with the second packaging layer together, and the second packaging layer and the MEMS component are not in contact with each other.

Herein, the second packaging layer may be formed as a single piece, and the second packaging layer and the first packaging layer may form a cavity structure. In this way, the whole MEMS component is protected in the cavity structure and isolated from the external.

In other embodiments of the disclosure, a sealing component 4 may include a first sealing layer 42.

The first sealing layer 42 is provided between a first packaging layer and a second packaging layer.

In the presence of the first sealing layer, the first packaging layer and the second packaging layer are connected with each other tightly.

Herein, when the first sealing layer is provided in a MEMS device, the first packaging layer and the second packaging layer may be connected with each other more tightly in the presence of the first sealing layer. In this way, there is no gap at contacting locations between the first packaging layer and the second packaging layer, an external small molecular substance cannot pass through the first packaging layer through the contacting locations between the first packaging layer and the second packaging layer to enter the cavity structure. Accordingly, a MEMS component is prevented from contacting with the external small molecular substance.

In other embodiments of the disclosure, a sealing component 4 may further include a second sealing layer 41.

The second sealing layer 41 is provided between a substrate 1 and a first packaging layer 21.

In the presence of the second sealing layer, the first packaging layer and the substrate are connected with each other tightly.

Herein, when the second sealing layer is provided in a MEMS device, the first packaging layer and the substrate may be connected with each other more tightly in the presence of the second sealing layer. In this way, there is no gap at contacting locations between the first packaging layer and the substrate, an external small molecular substance cannot pass through the first packaging layer through the contacting locations between the first packaging layer and the substrate to enter the cavity structure. Accordingly, a MEMS component is prevented from contacting with the external small molecular substance.

It is to be noted that both the first sealing layer and the second sealing layer may be simultaneously provided in the MEMS device in the embodiments of the disclosure. As an alternative, only the first sealing layer or the second sealing layer may be provided in the MEMS device.

The MEMS device provided by the embodiment of the disclosure is characterized in that the MEMS device may include the substrate, the packaging component provided on the substrate and the MEMS component provided inside the packaging component and on the substrate. The packaging component may further include the sealing component provided on the substrate and/or the packaging component, and the sealing component is used for preventing the external small molecule from contacting with the MEMS component. In this way, the MEMS device may have the sealing component for preventing the external small molecule from passing through the packaging component and accordingly contacting with the MEMS component. Thus, the problem that the small molecular substance enters an interior of a closed space and adhere to the MEMS component in the structure design of an existing MEMS device may be solved, the performance of the MEMS device may be improved, and the service life of the MEMS device may be prolonged.

Figure 3:
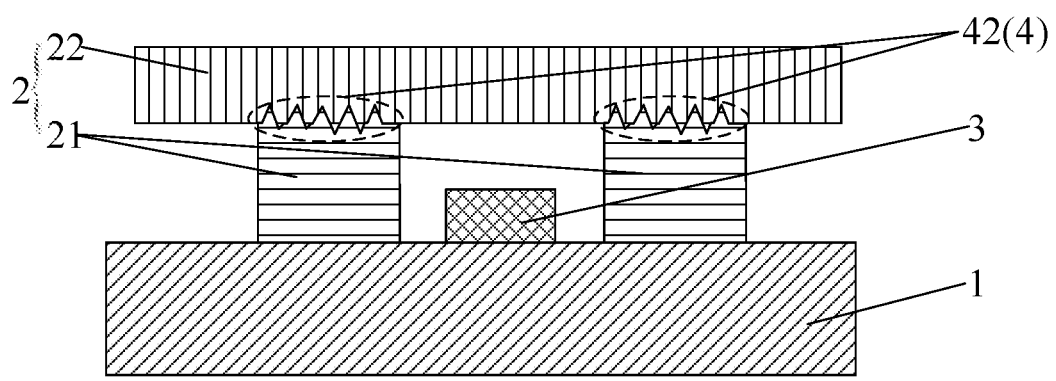
FIG. 3 illustrates a structure diagram of still another MEMS device provided by an embodiment of the disclosure.

Based on the above embodiments, the embodiment of the disclosure provides a MEMS device, as shown in FIG. 3. The MEMS device may include a substrate 1, a packaging component 2 provided on the substrate 1 and a MEMS component 3 provided inside the packaging component 2 and on the substrate 1. The MEMS device may further include a sealing component 4. The packaging component 2 may include a first packaging layer 21 and a second packaging layer 22. The sealing component 4 may include a first sealing layer 42.

The first packaging layer 21 is provided at a location on a substrate 1 without contacting with the MEMS component 3, and the first packaging layer surrounds the MEMS component 3.

The second packaging layer 22 is provided on a surface of the first packaging layer 21 far away from the substrate 1 and above a surface of the MEMS component 3 far away from the substrate 1.

The first packaging layer is connected with the second packaging layer together, and the second packaging layer and the MEMS component are not in contact with each other.

Herein, as shown in FIG. 3, the second packaging layer presents as a single piece. Moreover, a cavity structure, as shown in FIG. 1 and used for protecting the MEMS component therein, may be formed when the first packaging layer is connected with the second packaging layer together.

A second structure having irregular protrusions and depressions is provided at a location of the first packaging layer 21 facing the second packaging layer 22.

The first sealing layer 42 may include the second structure.

Herein, a material for forming the second packaging layer may enter the second structure on the first packaging layer when the second structure having irregular protrusions and depressions is formed at the location on the first packaging layer facing the second packaging layer. In this way, the material of the second packaging layer and a material of the first packaging layer may excellently contact with each other, and accordingly the first packaging layer and the second packaging layer may be connected with each other more tightly. Therefore, a small molecular substance cannot enter the interior of the cavity structure where the MEMS device is located through contacting locations between the first packaging layer and the second packaging layer, and accordingly the small molecular substance cannot contact with the MEMS component. Thus, the adverse influence to the performance of the MEMS device may be avoided.

It is to be noted that the embodiment of the disclosure is only to illustrate that the first sealing layer may be the second structure having irregular protrusions and depressions and not intended to limit a shape of the first sealing layer. Other shapes, of course, may be feasible as long as the material of the first packaging layer and that of the second packaging layer are ensured to excellently contact with each other.

Figure 2:
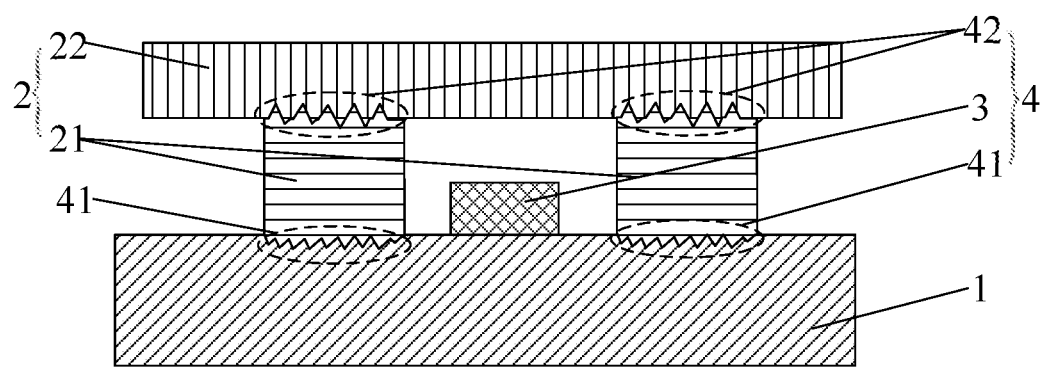
FIG. 2 illustrates a structure diagram of another MEMS device provided by an embodiment of the disclosure.

In other embodiments of the disclosure, as shown in FIG. 2, a sealing component 4 may further include a second sealing layer 41.

A first structure having irregular protrusions and depressions is provided at a location of a substrate 1 facing a first packaging layer 21.

The second sealing layer 41 may include the first structure.

Herein, a material for forming the first packaging layer may enter the first structure on the substrate when the first structure having irregular protrusions and depressions is formed at the location on the substrate facing the first packaging layer. In this way, the material of the first packaging layer and a material of the substrate may excellently contact with each other, and accordingly the first packaging layer and the substrate may be connected with each other more tightly. Thus, a small molecular substance cannot enter the interior of the cavity structure where the MEMS device is located through contacting locations between the first packaging layer and the substrate, and accordingly the small molecular substance cannot contact with the MEMS component. Therefore, the adverse influence to the performance of the MEMS device may be avoided.

It is to be noted that the embodiment of the disclosure is only to illustrate that the second sealing layer may be the first structure having irregular protrusions and depressions and not intended to limit a shape of the first sealing layer. Other shapes, of course, may be feasible as long as the material of the first packaging layer and that of the substrate are ensured to excellently contact with each other. In addition, the first structure may be identical with or different from the second structure.

Herein, a thickness of the first sealing layer is greater than 100 nm, and a thickness of the second sealing layer is greater than 100 nm.

That is to say, a height difference between a highest position and a lowest position in the first structure on the substrate and a height difference between a highest position and a lowest position in the second structure on the first packaging layer are greater than 100 nm.

Of course, the height difference between the highest position and the lowest position in the first structure is greater than 100 nm, and the height difference between the highest position and the lowest position in the second structure is greater than 100 nm, thereby ensuring that the material of the first packaging layer and that of the substrate may contact with each other more deeply, and the material of the first packaging layer and that of the second packaging layer may contact with each other more deeply. In this way, the first packaging layer and the substrate may be connected with each other more tightly, and the first packaging layer and the second packaging layer may be connected with each other more tightly.

In other embodiments of the disclosure, as shown in FIG. 1, a sealing component may only include a first structure having irregular protrusions and depressions on a substrate. Alternatively, as shown in FIG. 3, the sealing component may only include a second structure having irregular protrusions and depressions on a first packaging layer.

The MEMS device provided by the embodiment of the disclosure is characterized in that the MEMS device may include the sealing component for preventing an external small molecule from passing through a packaging component and accordingly contacting with a MEMS component. Thus, the problem that a small molecular substance may enter an interior of a closed space and adhere to the MEMS component in the structure design of an existing MEMS device may be solved, the performance of the MEMS device may be improved, and the service life of the MEMS device may be prolonged.

Figure 4:
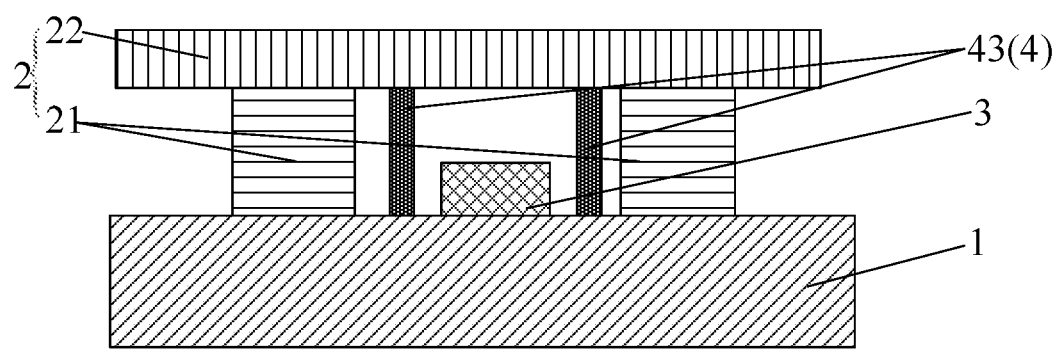
FIG. 4 illustrates a structure diagram of a MEMS device provided by another embodiment of the disclosure.

Based on the above embodiments, the embodiment of the disclosure provides a MEMS device, as shown in FIG. 4. The MEMS device may include a substrate 1, a packaging component 2 provided on the substrate 1 and a MEMS component 3 provided inside the packaging component 2 and on the substrate 1. The MEMS device may further include a sealing component 4. The packaging component 2 may include a first packaging layer 21 and a second packaging layer 22. The sealing component 4 may include at least one third sealing layer 43.

The first packaging layer 21 is provided at a location on a substrate 1 without contacting with a MEMS component 3, and the first packaging layer surrounds the MEMS component 3.

The second packaging layer 22 is provided on a surface of the first packaging layer 21 far away from the substrate 1 and above a surface of the MEMS component 3 far away from the substrate 1.

The first packaging layer is connected with the second packaging layer together, and the second packaging layer and the MEMS component are not in contact with each other.

The at least one third sealing layer 43 is provided between the substrate 1 and the second packaging layer 22.

The at least one third sealing layer 43 surrounds the MEMS component 3, and being surrounded by the first packaging layer 21.

The at least one third sealing layer 43 is not in contact with the first packaging layer 21 and the MEMS component 3.

It is to be noted that the sealing component including one third sealing layer is illustrated in FIG. 4. As shown in FIG. 4, the third sealing layer is not in contact with the first packaging layer and the MEMS component, and the third sealing layer is provided inside a cavity structure and surrounds the MEMS component. In this way, even though the small molecular substance outside a space where the MEMS device is located passes through the first packaging layer, the third sealing layer may prevent a small molecular substance from contacting with the MEMS component, because the third sealing layer is further provided surrounding the MEMS component. Of course, the at least one third sealing layer and the first packaging layer may partially contact with each other.

In other embodiments of the disclosure, if a sealing component 4 includes at least two third sealing layers 43, the third sealing layers may not contact with each other.

That is to say, multiple third sealing layers as shown in FIG. 4 may be provided in a MEMS device. However, the third sealing layers may be separated from each other. In this way, even though the small molecular substance outside a space where the MEMS device is located passes through the first packaging layer and the first third sealing layer, other third sealing layers may still prevent a small molecular substance from contacting with the MEMS component, because other third sealing layers may be provided surrounding the MEMS component. Namely, the more the third sealing layers the better. However, the quantity of the third sealing layers is not unlimited, and may be determined in accordance with a practical application and a requirement. Of course, the third sealing layers may partially contact with each other at certain locations.

The MEMS device provided by the embodiment of the disclosure is characterized in that the MEMS device may include the sealing component for preventing an external small molecule from passing through a packaging component and accordingly contacting with a MEMS component. Thus, the problem that a small molecular substance may enter an interior of a closed space and adhere to the MEMS component in the structure design of an existing MEMS device may be solved, the performance of the MEMS device may be improved, and the service life of the MEMS device may be prolonged.

Figure 5:
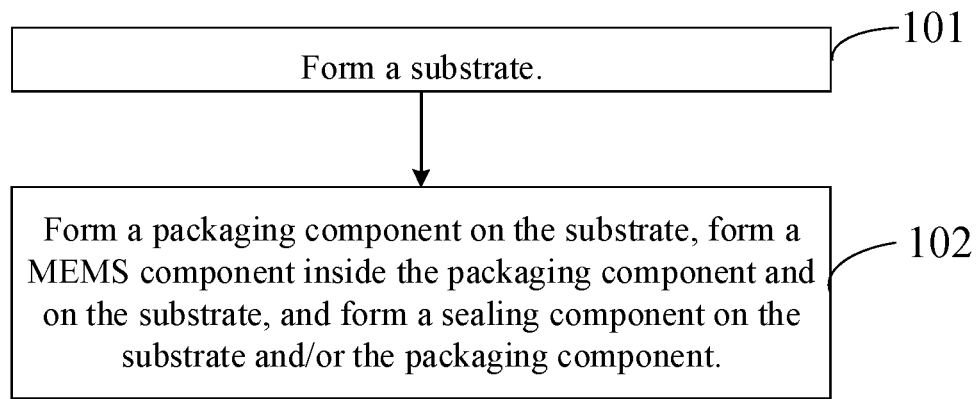
FIG. 5 illustrates a flow diagram of a fabrication method of a MEMS device provided by an embodiment of the disclosure.

Based on the above embodiments, the embodiment of the disclosure provides a fabrication method of a MEMS device. As shown in FIG. 5, the method may include the following steps.

At 101, a substrate is formed.

Herein, a material and a process of forming the substrate are not specifically defined in the embodiment, and the material and the process capable of realizing functions of the substrate in the related art may be feasible.

At 102, a packaging component is formed on the substrate, a MEMS component is formed inside the packaging component and on the substrate, and a sealing component is formed on the substrate and/or the packaging component.

Herein, the sealing component is used for preventing an external small molecular substance from contacting with the MEMS component.

It is to be noted that a material and a process of forming the packaging component are not specifically defined in the embodiment, and the material and the process capable of realizing functions of the packaging component in the related art may be feasible. Moreover, the embodiment may not specifically define a structure of the MEMS component, and the structure needing the packaging component surrounding the MEMS component may be feasible.

The sealing component may be formed with a process, such as electron beam bombardment, a screen printing process and an etching process. Herein, the specific process to be taken to form the sealing component may be determined in accordance with the specific structure and material of the sealing component.

The fabrication method of the MEMS device provided by the embodiment of the disclosure is characterized in that the formed MEMS device may have the sealing component for preventing an external small molecule from passing through the packaging component and accordingly contacting with the MEMS component. Thus, the problem that a small molecular substance may enter an interior of a closed space and adhere to the MEMS component in the structure design of an existing MEMS device may be solved, the performance of the MEMS device may be improved, and the service life of the MEMS device may be prolonged.

Figure 6:
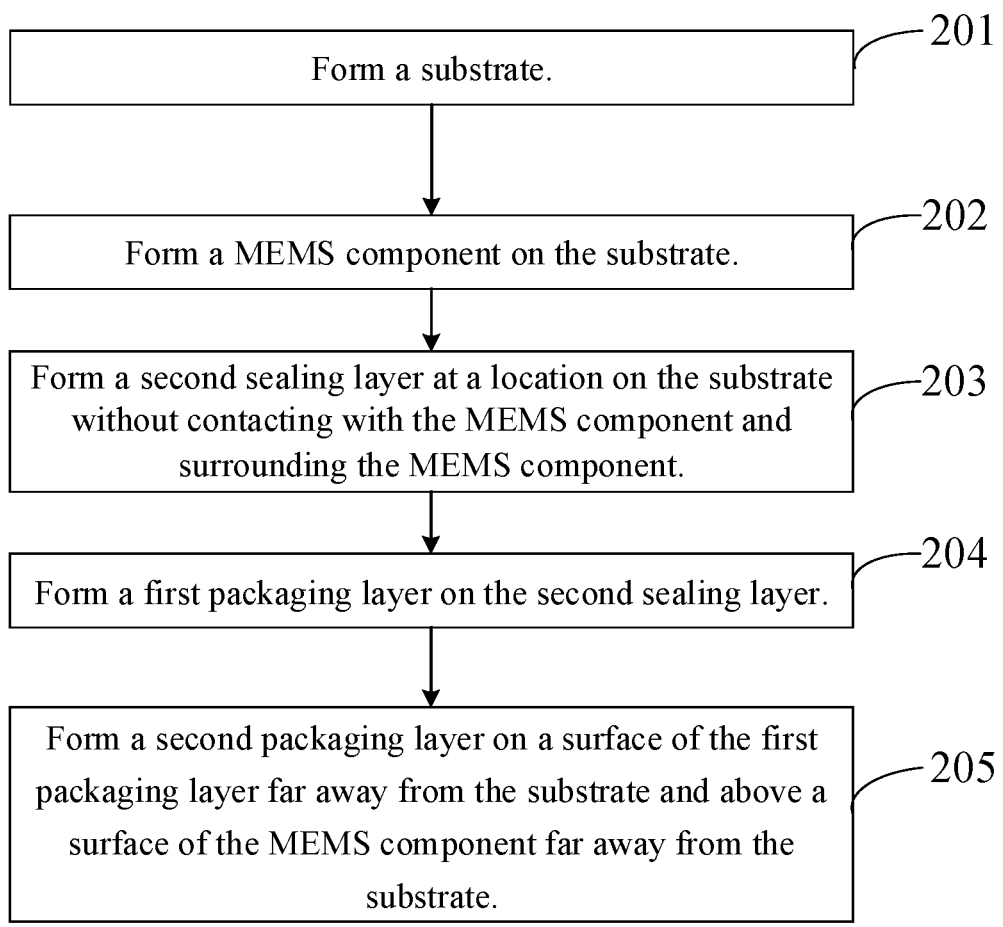
FIG. 6 illustrates a flow diagram of a fabrication method of another MEMS device provided by an embodiment of the disclosure.

Based on the above embodiments, the embodiment of the disclosure provides a fabrication method of a MEMS device. As shown in FIG. 6, the method may include the following steps.

At 201, a substrate is formed.
At 202, a MEMS component is formed on the substrate.
At 203, a second sealing layer is formed at a location on the substrate without contacting with the MEMS component and surrounding the MEMS component.

In a feasible implementation way, the second sealing layer may be formed by an etching process and other processes. A material of the second sealing layer may be identical with that of the substrate. The second sealing layer, of course, may be formed by other processes and other materials as well, provided that the second sealing layer has excellent sealing performance.

At 204, a first packaging layer may be formed on the second sealing layer.

Herein, a process and a material of forming the first packaging layer are not specifically defined in the embodiment, and the material and process capable of realizing packaging function of the first packaging layer in the related art may be feasible.

At 205, a second packaging layer is formed on a surface of the first packaging layer far away from the substrate and above a surface of the MEMS component far away from the substrate.

It is to be noted that a material and a process of forming the second packaging layer are not specifically defined in the embodiment, and the material and the process capable of realizing the packaging function of the second packaging layer in the related art may be feasible.

In other embodiments of the disclosure, 205 may be realized through the following way.

205a, a first sealing layer is formed on a surface of a first packaging layer far away from a substrate.

In a feasible implementation way, the first sealing layer may be formed with a process, such as electron beam bombardment and a screen printing process. A material of the first sealing layer may be identical with that of the first packaging layer. The first sealing layer, of course, may be formed by other processes and other materials as well, provided that the first sealing layer has excellent sealing performance.

205b, a second packaging layer is formed on a surface of the first sealing layer far away from the substrate and above a surface of a MEMS component far away from the substrate.

The first packaging layer is connected with the second packaging layer together, and the second packaging layer and the MEMS component are not in contact with each other.

In the presence of a second sealing layer, the first packaging layer and the substrate are connected with each other tightly.

In the presence of the first sealing layer, the first packaging layer and the second packaging layer are connected with each other tightly.

It is to be noted that the description of steps and concepts in the embodiment which are identical with those in other embodiments may refer to the description of the other embodiments and will not be elaborated here.

The fabrication method of the MEMS device provided by the embodiment of the disclosure is characterized in that the formed MEMS device may have a sealing component for preventing an external small molecule from passing through a packaging component and accordingly contacting with the MEMS component. Thus, the problem that a small molecular substance may enter an interior of a closed space and adhere to the MEMS component in the structure design of an existing MEMS device may be solved, the performance of the MEMS device may be improved, and the service life of the MEMS device may be prolonged.

Figure 7:
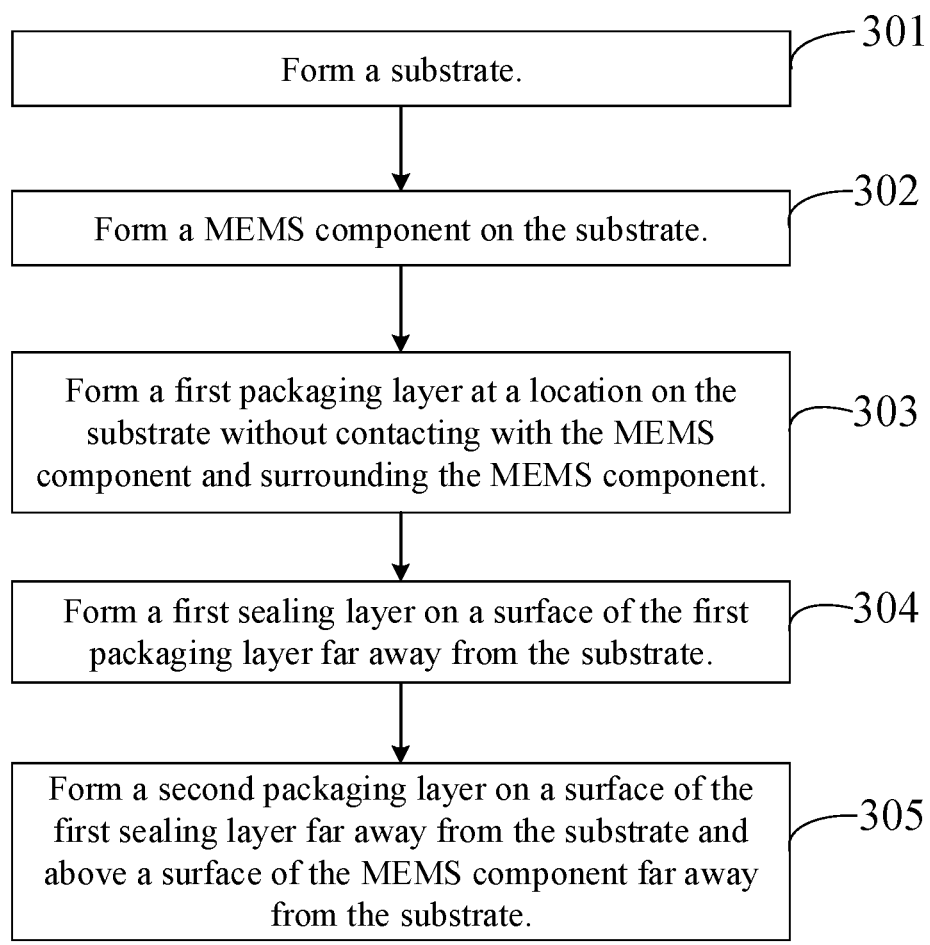
FIG. 7 illustrates a flow diagram of a fabrication method of still another MEMS device provided by an embodiment of the disclosure.

Based on the above embodiments, the embodiment of the disclosure provides a fabrication method of a MEMS device. As shown in FIG. 7, the method may include the following steps.

At 301, a substrate is formed.

At 302, a MEMS component is formed on the substrate.

At 303, a first packaging layer is formed at a location on the substrate without contacting with the MEMS component and surrounding the MEMS component.

At 304, a first sealing layer is formed on a surface of the first packaging layer far away from the substrate.

At 305, a second packaging layer is formed on a surface of the first sealing layer far away from the substrate and above a surface of the MEMS component far away from the substrate.

Herein, in the presence of the first sealing layer, the first packaging layer and the second packaging layer are connected with each other tightly, and the second packaging layer and the MEMS component are not in contact with each other.

It is to be noted that the description of steps and concepts in the embodiment which are identical with those in other embodiments may refer to the description of the other embodiments and will not be elaborated here.

The fabrication method of the MEMS device provided by the embodiment of the disclosure is characterized in that the formed MEMS device may have a sealing component for preventing an external small molecule from passing through a packaging component and accordingly contacting with the MEMS component. Thus, the problem that a small molecular substance may enter an interior of a closed space and adhere to the MEMS component in the structure design of an existing MEMS device may be solved, the performance of the MEMS device may be improved, and the service life of the MEMS device may be prolonged.

Based on the above embodiments, in other embodiments of the disclosure, 203 may be realized through the following way.

A first structure having irregular protrusions and depressions is formed at a location on a substrate without contacting with the MEMS component and surrounding the MEMS component by an etching process.

Correspondingly, 204 may be realized through the following way.

A first packaging layer is formed at the location on the substrate where the first structure is located.

Figure 8:
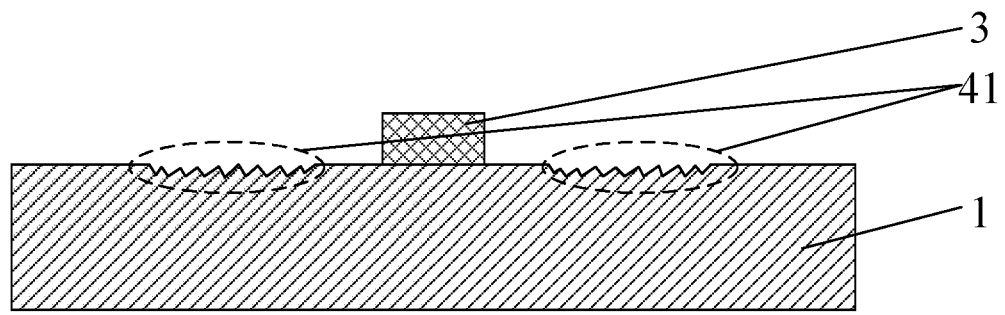
FIG. 8 illustrates a structure diagram during fabricating a MEMS device provided by an embodiment of the disclosure.
Figure 9:
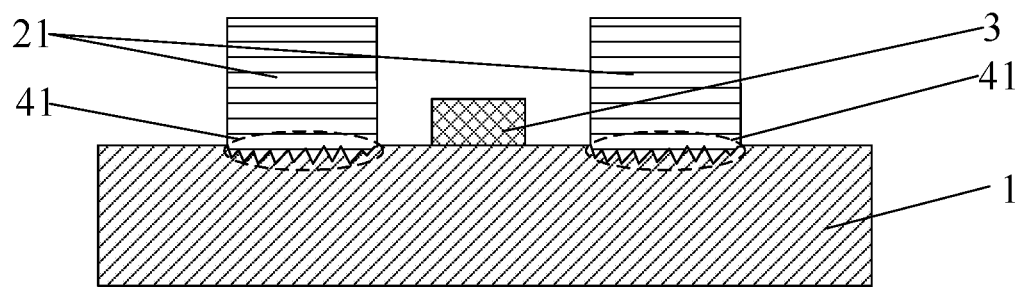
FIG. 9 illustrates a structure diagram during fabricating another MEMS device provided by an embodiment of the disclosure.

That is to say, a surface of the substrate may be subjected to surface roughening treatment with an etching process, as shown in FIG. 8, so as to form the first structure having irregular protrusions and depressions in which a height difference between a highest position and a lowest position is greater than 100 nm, and accordingly achieve a second sealing layer. Then a material, such as metal, ceramic and an organic matter may be coated or mounted on the first structure formed in FIG. 8, so as to achieve the first packaging layer, and accordingly achieve the structure as shown in FIG. 9. Finally, the material, such as the metal, the ceramic and the organic matter may be mounted to an outermost layer in the structure as shown in FIG. 9, so as to achieve a second packaging layer, and accordingly achieve the structure as shown in FIG. 1.

Based on the above embodiments, in other embodiments of the disclosure, 205a and 304 may be realized through the following way.

A second structure having irregular protrusions and depressions is formed on a surface of a first packaging layer far away from a substrate by electron beam bombardment or a screen printing process.

Correspondingly, 205b and 305 may be realized through the following way.

A second packaging layer is formed at a location on the first packaging layer where the second structure is located and above a surface of a MEMS component far away from the substrate.

Figure 10:
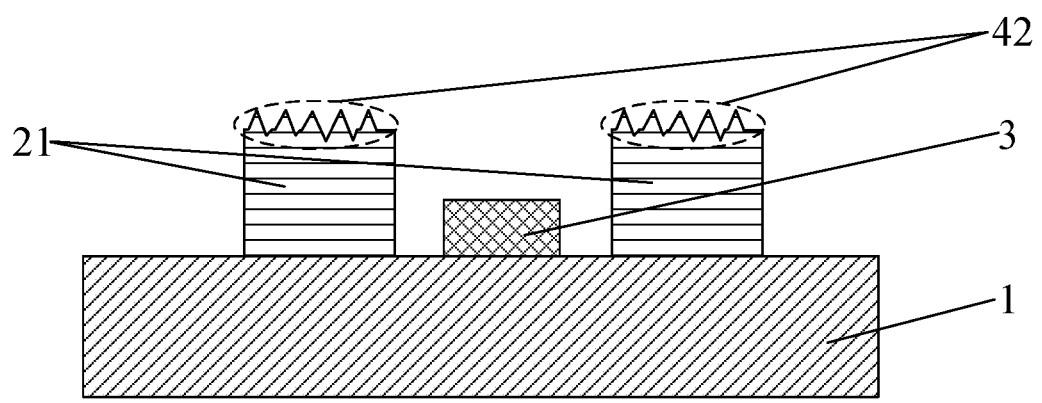
FIG. 10 illustrates a structure diagram during fabricating still another MEMS device provided by an embodiment of the disclosure.
Figure 11:
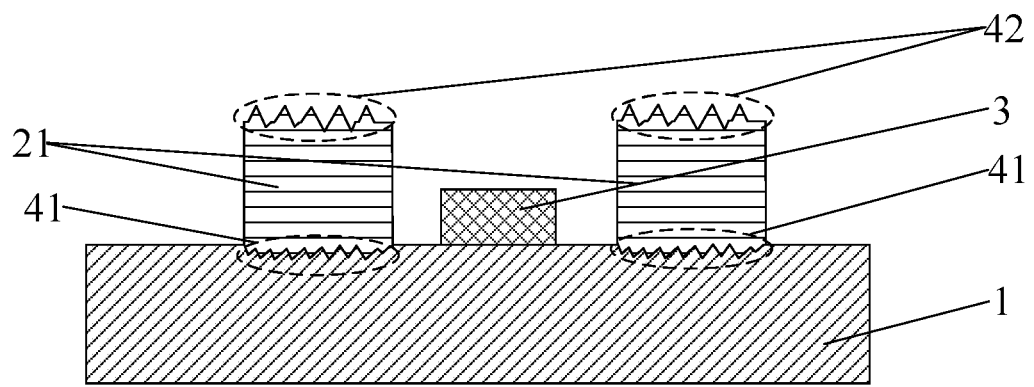
FIG. 11 illustrates a structure diagram during fabricating a MEMS device provided by another embodiment of the disclosure.

That is to say, the surface of the first packaging layer may be subjected to plasma bombardment by the process, such as electron beam bombardment and the screen printing process, so as to form the second structure having irregular protrusions and depressions in which a height difference between a highest position and a lowest position is greater than 100 nm, and accordingly achieve a first sealing layer. If a MEMS device includes the first sealing layer only, the structure as shown in FIG. 10 may be formed at this time. If the MEMS device includes both the first sealing layer and a second sealing layer, the structure as shown in FIG. 11 may be formed at this time. Finally, a material, such as metal, ceramic and an organic matter may be mounted to an outermost layer in the structure shown in FIG. 10 or FIG. 11, so as to achieve the second packaging layer, and accordingly achieve the structure shown in FIG. 2 or FIG. 3.

Figure 12:
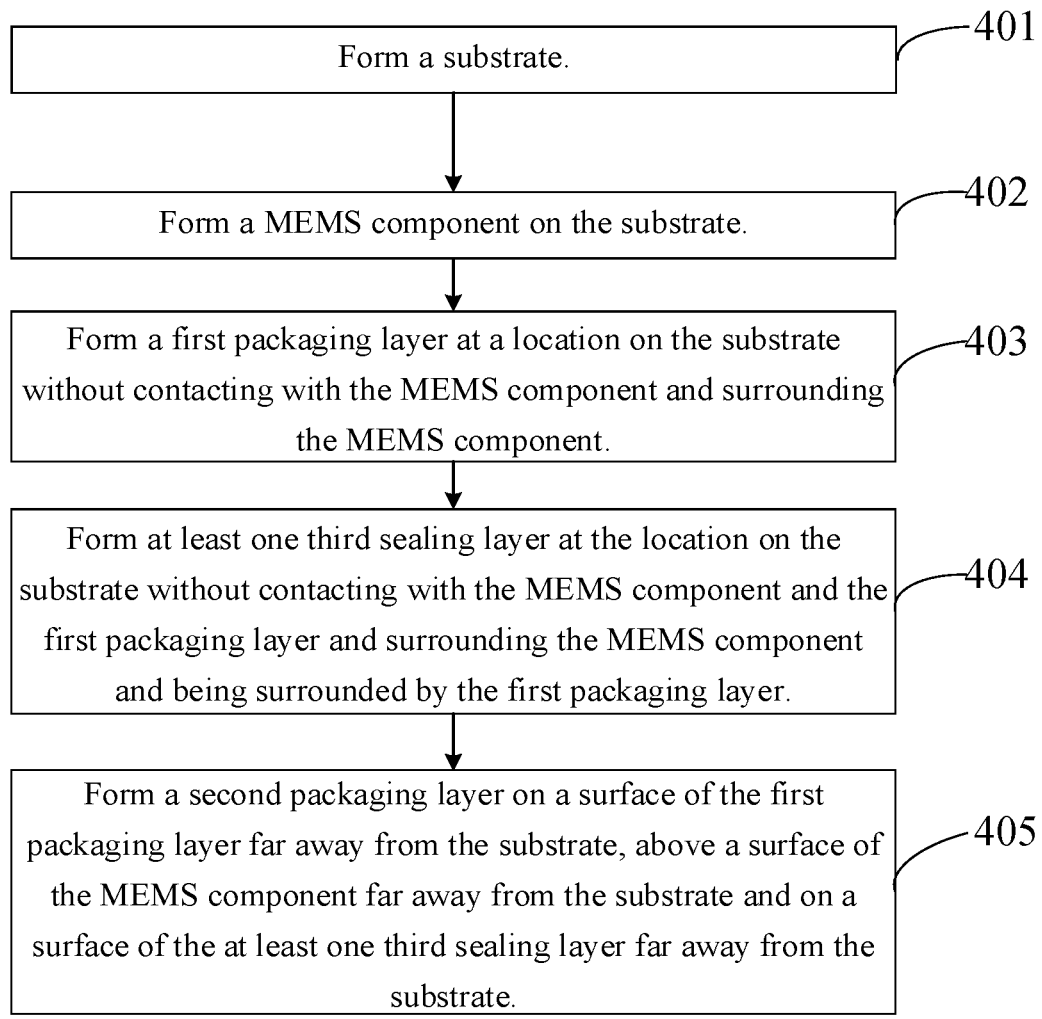
FIG. 12 illustrates a flow diagram of a fabrication method of a MEMS device provided by another embodiment of the disclosure.

Based on the above embodiments, the embodiment of the disclosure provides a fabrication method of a MEMS device. As shown in FIG. 12, the method may include the following steps.

At 401, a substrate is formed.

At 402, a MEMS component is formed on the substrate.

At 403, a first packaging layer is formed at a location on the substrate without contacting with the MEMS component and surrounding the MEMS component.

At 404, at least one third sealing layer is formed at the location on the substrate without contacting with the MEMS component and the first packaging layer and surrounding the MEMS component and being surrounded by the first packaging layer.

Figure 13:
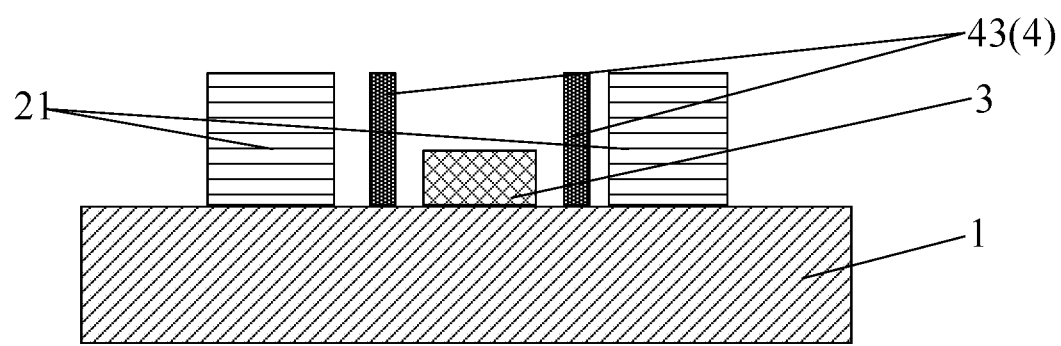
FIG. 13 illustrates a structure diagram during fabricating another MEMS device provided by another embodiment of the disclosure.

In other embodiments of the disclosure, at least one third sealing layer may be obtained by coating or mounting a material, such as metal, ceramic and an organic matter to a location on a substrate without contacting with the MEMS component and the first packaging layer and surrounding the MEMS component and being surrounded by the first packaging layer. In a feasible implementation way, if the at least one third sealing layer is prepared from a dry film photoresist material, one layer of the dry film photoresist material may be mounted to the substrate with an mounting process at this time, the dry film photoresist material mounted to other locations is developed through an exposure step and the at least one third sealing layer is formed at the location without contacting with the MEMS component and the first packaging layer and surrounding the MEMS component and being surrounded by the first packaging layer. It is to be noted that taking the MEMS device including one third sealing layer as an example, a structure as shown in FIG. 13 may be achieved when the dry film photoresist material is mounted and developed by the above process. Of course, the at least one third sealing layer and the first packaging layer may partially contact with each other.

Herein, a sealing component may include at least two third sealing layers, and 404 may be realized by the following way.

The at least two third sealing layers, which are not in contact with each other, are sequentially formed at a location on the substrate without contacting with the MEMS component and the first packaging layer and surrounding the MEMS component and being surrounded by the first packaging layer.

It is to be noted that each of the third sealing layers may be formed with the above process and materials for forming the third sealing layers. In addition, the third sealing layers are formed sequentially. Of course, the third sealing layers may partially contact with each other.

At 405, a second packaging layer is formed on surfaces of the first packaging layer and the at least one third sealing layer far away from the substrate, above a surface of the MEMS component far away from the substrate and on a surface of the at least one third sealing layer far away from the substrate.

The second packaging layer and the MEMS component are not in contact with each other.

The first packaging layer is connected with the second packaging layer together, and the third sealing layer is connected with the second packaging layer together.

In a feasible implementation way, if only one third sealing layer is included, one layer of the dry film photoresist material may be mounted to the outermost layer of the structure as shown in FIG. 13, so as to form the second packaging layer, accordingly obtaining the structure as shown in FIG. 4.

It is to be noted that the description of steps and concepts in the embodiment which are identical with those in other embodiments may refer to the description of the other embodiments and will not be elaborated here.

The fabrication method of the MEMS device provided by the embodiment of the disclosure is characterized in that the formed MEMS device may have the sealing component for preventing an external small molecule from passing through a packaging component and accordingly contacting with the MEMS component. Thus, the problem that a small molecular substance may enter an interior of a closed space and adhere to the MEMS component in the structure design of an existing MEMS device may be solved, the performance of the MEMS device may be improved, and the service life of the MEMS device may be prolonged.

The above is only the preferred embodiments of the disclosure and not intended to limit the scope of protection of the disclosure.

The invention claimed is:

1. A Micro-Electro-Mechanical System (MEMS) device, comprising: a substrate, a packaging component provided on the substrate and a MEMS component provided inside the packaging component and on the substrate; the device further comprises a sealing component,
wherein the sealing component is provided on the substrate and/or the packaging component;
wherein the sealing component is provided to prevent an external small molecular substance from contacting with the MEMS component,
wherein the packaging component comprises a first packaging layer and a second packaging layer,
wherein the sealing component comprises at least one of a first sealing layer or a second sealing layer,
wherein a second structure having irregular protrusions and depressions is provided at a location of the first packaging layer facing the second packaging layer; and
wherein the first sealing layer comprises the second structure.

2. The device of claim 1,
wherein the first packaging layer is provided at a location on the substrate without contacting with the MEMS component, and the first packaging layer surrounds the MEMS component;
the second packaging layer is provided on a surface of the first packaging layer far away from the substrate and above a surface of the MEMS component far away from the substrate; and
the first packaging layer is connected with the second packaging layer together,
wherein the second packaging layer and the MEMS component are not in contact with each other.

3. The device of claim 2,
wherein the first sealing layer is provided between the first packaging layer and the second packaging layer; and
in the presence of the first sealing layer, the first packaging layer and the second packaging layer are connected with each other tightly.

4. The device of claim 3, wherein a thickness of the first sealing layer is greater than 100 nm.

5. The device of claim 3,
wherein the second sealing layer is provided between the substrate and the first packaging layer; and
in the presence of the second sealing layer, the first packaging layer and the substrate are connected with each other tightly.

6. The device of claim 2,
wherein the second sealing layer is provided between the substrate and the first packaging layer; and
in the presence of the second sealing layer, the first packaging layer and the substrate are connected with each other tightly.

7. The device of claim 6, wherein a first structure having irregular protrusions and depressions is provided at a location of the substrate facing the first packaging layer; and
the second sealing layer comprises the first structure.

8. The device of claim 7, wherein a thickness of the second sealing layer is greater than 100 nm.

9. The device of claim 6, wherein a thickness of the second sealing layer is greater than 100 nm.

10. The device of claim 2, wherein the sealing component comprises at least one third sealing layer, and
wherein the at least one third sealing layer is provided between the substrate and the second packaging layer; and
the at least one third sealing layer surrounds the MEMS component, and is surrounded by the first packaging layer.

11. The device of claim 10, wherein the at least one third sealing layer is not in contact with the first packaging layer and the MEMS component.

12. The device of claim 1, wherein a thickness of the first sealing layer is greater than 100 nm.

13. A fabrication method of a Micro-Electro-Mechanical System (MEMS) device, comprising:
forming a substrate;
forming a packaging component on the substrate, forming a MEMS component inside the packaging component and on the substrate, and forming a sealing component on the substrate and/or the packaging component, and
wherein the sealing component is provided to prevent an external small molecular substance from contacting with the MEMS component,
wherein the packaging component comprises a first packaging layer and a second packaging layer; the sealing component comprises a first sealing layer; and wherein the forming the packaging component on the substrate, the forming the MEMS component inside the packaging component and on the substrate, and the forming the sealing component on the substrate and/or the packaging component comprise:
forming the MEMS component on the substrate;
forming the first packaging layer at a location on the substrate without contacting with the MEMS component and surrounding the MEMS component;
forming the first sealing layer on a surface of the first packaging layer far away from the substrate;
forming the second packaging layer on the surface of the first sealing layer far away from the substrate and above a surface of the MEMS component far away from the substrate;
in the presence of the first sealing layer, the first packaging layer and the second packaging layer are connected with each other tightly,
wherein the first packaging layer is connected with the second packaging layer together, and
wherein the second packaging layer and the MEMS component are not in contact with each other,
wherein the forming the first sealing layer on the surface of the first packaging layer far away from the substrate comprises:
forming a second structure having irregular protrusions and depressions on the surface of the first packaging layer far away from the substrate with electron beam bombardment or a screen printing process; and
the forming the second packaging layer on the surface of the first sealing layer far away from the substrate and above the surface of the MEMS component far away from the substrate comprises:
forming the second packaging layer at a location on the first packaging layer where the second structure is located and above the surface of the MEMS component far away from the substrate.

14. The method of claim 13, wherein the sealing component further comprises a second sealing layer; and
wherein the forming the first packaging layer at the location on the substrate without contacting with the MEMS component and surrounding the MEMS component comprises:
forming the second sealing layer at the location on the substrate without contacting with the MEMS component and surrounding the MEMS component;
forming the first packaging layer on the second sealing layer,
in the presence of the second sealing layer, the first packaging layer and the substrate are connected with each other tightly.

15. The method of claim 14, wherein the forming the second sealing layer at the location on the substrate without contacting with the MEMS component and surrounding the MEMS component comprises:
forming a first structure having irregular protrusions and depressions at the location on the substrate without contacting with the MEMS component and surrounding the MEMS component by an etching process; and
the forming the first packaging layer on the second sealing layer comprises:
forming the first packaging layer at the location on the substrate where the first structure is located.

16. The method of claim 13, wherein the sealing component comprises at least one third sealing layer; and
wherein the forming the packaging component on the substrate, the forming the MEMS component inside the packaging component and on the substrate, and the forming the sealing component on the substrate and/or the packaging component comprise:
forming the MEMS component on the substrate;
forming the first packaging layer at a location on the substrate without contacting with the MEMS component and surrounding the MEMS component;
forming the at least one third sealing layer at a location on the substrate without contacting with the MEMS component and the first packaging layer and surrounding the MEMS component and being surrounded by the first packaging layer;
forming the second packaging layer on surfaces of the first packaging layer and the at least one third sealing layer far away from the substrate and above the surface of the MEMS component far away from the substrate, wherein the second packaging layer and the MEMS component are not in contact with each other; and
forming the second packaging layer on a surface of the at least one third sealing layer far away from the substrate,
wherein the first packaging layer is connected with the second packaging layer together, and the third sealing layer is connected with the second packaging layer together.

17. A fabrication method of a Micro-Electro-Mechanical System (MEMS) device, comprising:
forming a substrate;
forming a packaging component on the substrate, forming a MEMS component inside the packaging component and on the substrate, and forming a sealing component on the substrate and/or the packaging component, and
wherein the sealing component is provided to prevent an external small molecular substance from contacting with the MEMS component,
wherein the packaging component comprises the first packaging layer and the second packaging layer, and the sealing component comprises a second sealing layer; and
wherein the forming the packaging component on the substrate, the forming the MEMS component inside the packaging component and on the substrate, and the forming the sealing component on the substrate and/or the packaging component comprise:
forming the MEMS component on the substrate;
forming the second sealing layer at a location on the substrate without contacting with the MEMS component and surrounding the MEMS component;
forming the first packaging layer on the second sealing layer;
forming the second packaging layer on a surface of the first packaging layer far away from the substrate and above a surface of the MEMS component far away from the substrate,
in the presence of the second sealing layer, the first packaging layer and the substrate are connected with each other tightly;
wherein the first packaging layer is connected with the second packaging layer together; and
wherein the second packaging layer and the MEMS component are not in contact with each other,
wherein the forming the second sealing layer at the location on the substrate without contacting with the MEMS component and surrounding the MEMS component comprises:
forming a first structure having irregular protrusions and depressions at the location on the substrate without contacting with the MEMS component and surrounding the MEMS component by an etching process; and
the forming the first packaging layer on the second sealing layer comprises:
forming the first packaging layer at the location on the substrate where the first structure is located.

* * * * *